(12) United States Patent
Yoshida et al.

(10) Patent No.: US 6,790,278 B2
(45) Date of Patent: Sep. 14, 2004

(54) METHOD FOR PREPARING LOW-RESISTANT P-TYPE SRTIO$_3$

(75) Inventors: Hiroshi Yoshida, Kawanishi (JP); Kiyoshi Betsuyaku, Minoh (JP); Tomoji Kawai, Minoh (JP); Hidekazu Tanaka, Suita (JP)

(73) Assignee: Japan Science and Technology Agency, Kawaguchi (JP)

( * ) Notice: Subject to any disclaimer, the term of this patent is extended or adjusted under 35 U.S.C. 154(b) by 59 days.

(21) Appl. No.: 10/221,183
(22) PCT Filed: Mar. 8, 2001
(86) PCT No.: PCT/JP01/01842
§ 371 (c)(1),
(2), (4) Date: Dec. 23, 2002
(87) PCT Pub. No.: WO01/71814
PCT Pub. Date: Sep. 27, 2001

(65) Prior Publication Data
US 2003/0172869 A1 Sep. 18, 2003

(30) Foreign Application Priority Data
Mar. 23, 2000 (JP) ........................... 2000-087069

(51) Int. Cl.$^7$ ............................... C30B 29/32
(52) U.S. Cl. ................ 117/88; 117/104; 117/105; 117/108; 117/949
(58) Field of Search .............. 117/949, 88, 105, 117/108, 104

(56) References Cited
PUBLICATIONS

Chiang et a., "Grain–boundary chemistry of barium titanate and strontuin titanate. I. High temperature equilibrium space change", Journal of the American Ceramic Society vol. 73, No. 11 Nov. 1990 pp. 3278–3285 abstact only.*
Glinchuk et al., "ESR study of impurities in strontium titanate films", Physics of the Solid State, vol. 43 No. 5 May 2001 pp. 809–812 abstract only.*
Patent Abstract of Japan No. 07–273220, dated Oct. 20, 1995. See PCT search rpt.
Patent Abstract of Japan No. 2000–026194, dated Jan. 25, 2000. See PCT search report.
Patent Abstract of Japan No. 06–140385, dated May 20, 1994.
Patent Abstract of Japan No. 09–153598, dated Jun. 10, 1997.
Jong–Won Yoon et al.; Applied Physics Letters, vol. 74, No. 5, pp. 738–740, Feb. 1, 1999.
Meeting Abstracts of the Physical Society of Japan, vol. 55. Issue 1. Part 4, p. 842, Sectional Meeting, Mar. 22–25, 2000.

* cited by examiner

Primary Examiner—Robert Kunemund
(74) Attorney, Agent, or Firm—Westerman, Hattori, Daniels & Adrian, LLP

(57) ABSTRACT

The present invention provides a method for preparing a novel low-resistance p-type SrTiO$_3$ capable of opening the way for oxide electronics in combination with an already developed low-resistance n-type SrTiO$_3$. The method is characterized in that an acceptor and a donor are co-doped into a perovskite-type transition-metal oxide SrTiO$_3$ during crystal growth.

6 Claims, 3 Drawing Sheets

METHOD FOR PREPARING LOW-RESISTANT P-TYPE SRTIO₃

TECHNICAL FIELD

The present invention relates to a method for reducing the resistance of a perovskite-type transition-metal oxide $SrTiO_3$.

BACKGROUND ART

A perovskite-type transition-metal oxide $SrTiO_3$ has a wide bandgap energy of 3.3 eV. Therefore, $SrTiO_3$ gets attention as a base material of other perovskite-type transition-metal oxides, a nonlinear resistive element, a ferroelectric material or the like, and a $SrTiO_3$ film having a high dielectric constant are actively developing.

A high dielectric film consisting of $SrTiO_3$ is typically prepared through a spattering method using a $SrTiO_3$ sintered body as a target (e.g. Japanese Patent Laid-Open Publication Nos. 6-140385 and 9-153598).

On the other hand, it has been difficult to prepare a p-type $SrTiO_3$ having a desirably lowered resistance even by adopting any conventional technologies. Specifically, a conventional method of doping a p-type dopant N (nitrogen) by itself has been able to increase carrier concentration only up to about $10^{14}$ cm$^{-3}$ due to the deep impurity level and resulting low activation rate of N acceptor. Further, the doping of N as an acceptor causes a compensation effect, which inevitably leads to oxygen deficiency serving as a donor. Such negative factors obstruct to achieve a desired low-resistance p-type $SrTiO_3$.

DISCLOSURE OF INVENTION

The inventors have found a new technical concept of simultaneously doping or co-doping an acceptor with a donor having a high chemical bonding strength with the acceptor intentionally to provide a shallowed acceptor level and suppressed compensation effect, and have verified that the above problem could be solved by the developed technique.

According to a first aspect of the present invention, there is provided a method for preparing a low-resistance p-type $SrTiO_3$, wherein an acceptor and a donor are co-doped into a perovskite-type transition-metal oxide $SrTiO_3$ during crystal growth.

According to a second aspect of the present invention, there is provided a method for preparing a low-resistance p-type $SrTiO_3$, wherein an acceptor (A) and a donor (D) are co-doped into a perovskite-type transition-metal oxide $SrTiO_3$ during crystal growth to form an impurity complex (A-D-A) of the acceptor and the donor through a crystal growth method in a thermal nonequilibrium state, whereby an impurity formation energy is reduced by less than that in a method of doping the acceptor by itself, so as to provide an increased concentration of the acceptor.

According to a third aspect of the present invention, there is provided a method for preparing a low-resistance p-type $SrTiO_3$, wherein an acceptor (A) and a donor (D) are co-doped into a perovskite-type transition-metal oxide $SrTiO_3$ during crystal growth to form an impurity complex (A-D-A) of the acceptor and the donor through a crystal growth method in a thermal nonequilibrium state, whereby a Coulomb scattering mechanism having a long range force is converted into a dipole or multipole scattering mechanism having a short range force, so as to provide an increased mobility of the impurities.

According to a fourth aspect of the present invention, there is provided a method for preparing a low-resistance p-type $SrTiO_3$, wherein an acceptor (A) and a donor (D) are co-doped into a perovskite-type transition-metal oxide $SrTiO_3$ during crystal growth to form an impurity complex (A-D-A) of the acceptor and the donor through a crystal growth method in a thermal nonequilibrium state, whereby the acceptor has a shallower impurity level than that in a method of doping N by itself, so as to provide an increased activation rate of the acceptor.

In the present invention, in order to prevent oxygen deficiency, the donor may be Nb oxide, and the acceptor may be N oxide.

Further, the donor may be an n-type dopant of Nb (niobium), and the acceptor may be a p-type dopant of N (nitrogen). In this case, the n-type dopant of Nb and the p-type dopant of N are co-doped at a rate of 1:(1+x) where 0<x<100, so as to provide p-type carriers doped in a high concentration of $10^{19}$ cm$^{-3}$ to $10^{21}$ cm$^{-3}$. In the ratio of Nb (niobium) to N (nitrogen), the amount of N should be greater than that of Nb to obtain a p-type $SrTiO_3$, and a significant co-doping effect can be observed at the ratio of up to about 1:100.

In the method of the present invention, the $SrTiO_3$ crystal can be grown on a substrate such as Si, $SrTiO_3$ or $\beta Al_2O_3$ by employing an MBE (Molecular Beam Epitaxy) method, laser-MBE method, CVD (Chemical Vapor Deposition) method or spattering method.

The CVD method promotes crystal growth under hydrogen atmosphere, and a hydrogen donor will remain in the resulting crystal because hydrogen acts as a donor. However, the remaining donor can be removed by subjecting the resulting crystal to annealing (at about 500° C.), and thereby an acceptor acts to provide a desirable low-resistance p-type crystal.

BRIEF DESCRIPTION OF THE DRAWINGS

FIG. 1(*b*) is a schematic diagram showing the relationship between a repulsive force and an attracting force of the impurity complex.

FIG. 4(*b*) is an energy spectrum diagram showing a state density when N and Nb are co-doped at a ratio of 2:1 into $SrTiO_3$ during crystal growth.

DESCRIPTION OF THE PREFERRED EMBODIMENT

Figure 1:
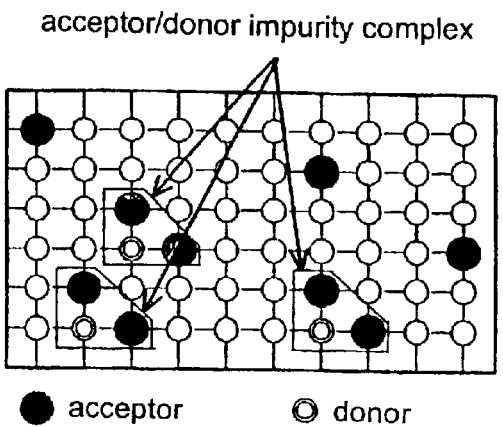
FIG. 1(*a*) is a schematic diagram showing an impurity complex of an acceptor and a donor, which is formed in $SrTiO_3$ crystal-grown by a method of the present invention.
Figure 1:
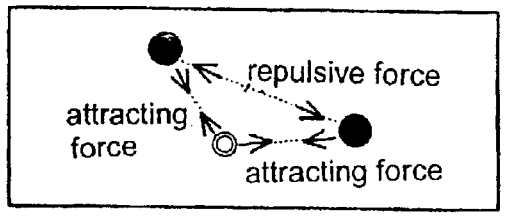

FIG. 1(*a*) is a schematic diagram showing an impurity complex of an acceptor and a donor, which is formed when $SrTiO_3$ is crystal-grown according to a method of the present invention. FIG. 1(b) is a schematic diagram showing the relationship between a repulsive force and an attracting force of the impurity complex.

When an acceptor (A) and a donor (D) are simultaneously doped or co-doped into $SrTiO_3$ through a crystal growth method in a thermal nonequilibrium state, a (A-D-A) complex as shown in FIG. 1(a), which is an impurity complex of the acceptors ● and the donors ◎, is formed during the crystal growth.

Figure 2:
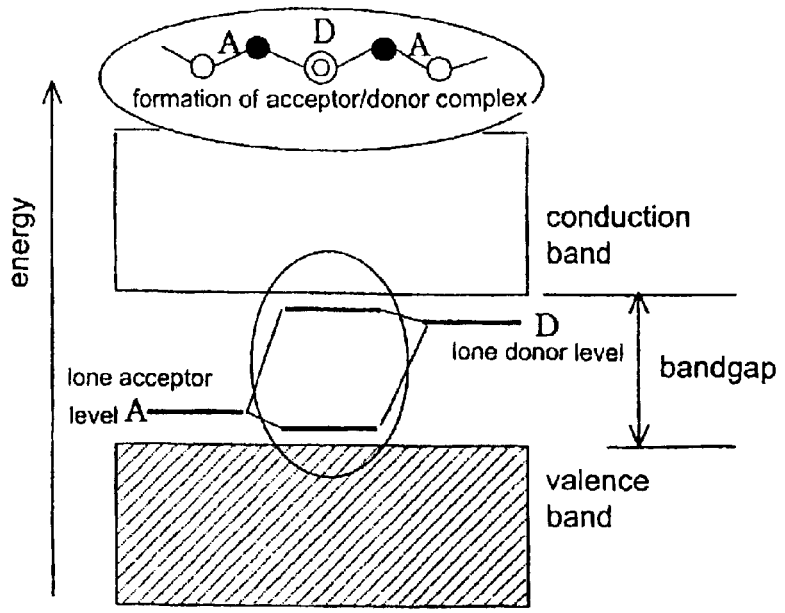
FIG. 2 is a schematic diagram showing an acceptor level and a donor level in an A-D-A complex of $SrTiO_3$ crystal-grown by a method of the present invention.

As shown in FIG. 1(b), a repulsive force acts between the respective acceptors and an attracting force acts between each of the acceptors and the donor. Thus, the impurity complex is formed by the acceptor/donor ratio of 2:1. FIG. 2 is a schematic diagram showing an acceptor level and a donor level in an A-D-A complex of $SrTiO_3$ crystal-grown by a method of the present invention.

When an impurity complex of acceptors ● and donors ◎ is formed by co-doping an n-type dopant of Nb (niobium) and a p-type dopant of N (nitrogen) at a ratio of 1:(1+x) where 0<x<100, respective wave functions of the acceptors and the donors are hybridized as shown in FIG. 2. Thus, the co-doping allows the acceptors to have a shallower impurity level than the deep impurity level provided by the conventional method of doping N by itself (hereinafter referred to as "independent doping method"), so that an activation rate of the acceptors is increased.

Further, an impurity formation energy can be reduced by less than that in the independent doping, to provide an increased concentration (solid solubility limit) of the acceptors. In addtion, a Coulomb scattering mechanism having a long range force can be converted into a dipole or multipole scattering mechanism having a short range force to provide an about double-digit-increased mobility of the impurities.

In the conventional method of doping N by itself into $SrTiO_3$, the number of doped carriers is only about $10^{14}$ $cm^{-3}$. By contrast, the co-doping method of the present invention can dope carriers in a high concentration of about $10^{19}$ $cm^{-3}$ to $10^{21}$ $cm^{-3}$.

EXAMPLE

First Example

Crystal Growth Through MBE Method

Figure 3:
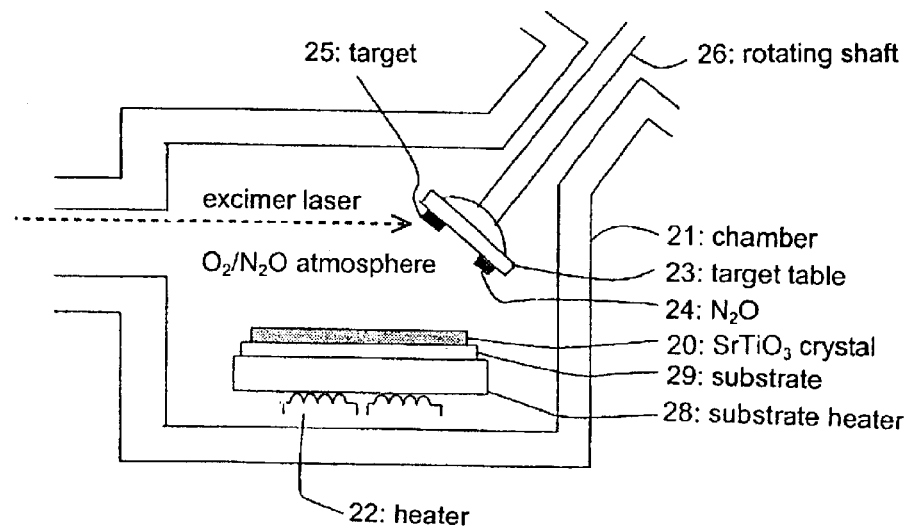
FIG. 3 is a schematic vertical sectional view of a laser-MBE crystal-growth apparatus used in a first example of a method of the present invention.

FIG. 3 is a schematic vertical sectional view of a laser-MBE crystal-growth apparatus used in this example. A substrate 29 made of Si was housed in a chamber 21 with placing on a substrate heater 28 heated by a heater 22. A target 25 formed by sintering Sr oxide/Ti oxide in the form of a pellet was fixedly disposed on a target table 23 fixed to the end of a rotating shaft 26 to be rotated by a rotational drive unit outside the chamber 21. A $N_2O$ 24 as a dopant was fixedly disposed at a $N_2O$ gas source position of the target table 23. A excimer laser was irradiated from the outside of the chamber 21 onto the target 25 and the $N_2O$ 24 to introduce abrasion in them, and an n-type dopant of metal Nb (Nb oxide was used as the target) and a p-type dopant of N was co-doped at a ration of 1:2 while crystal-growing $SrTiO_3$ on the substrate 29 under oxygen/$N_2O$ atmosphere.

Figure 4A:
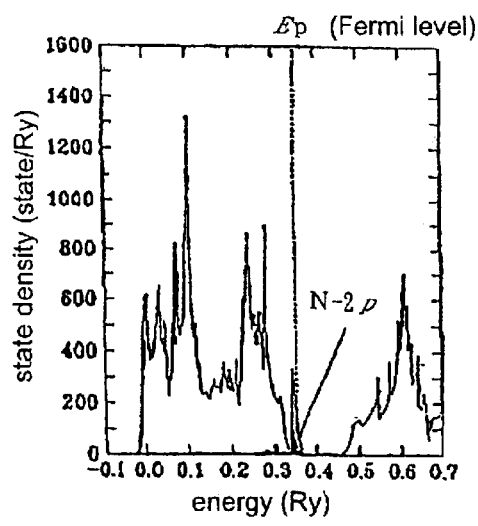
FIG. 4(*a*) is an energy spectrum diagram showing a state density when N is doped by itself into $SrTiO_3$ during crystal growth.
Figure 4B:
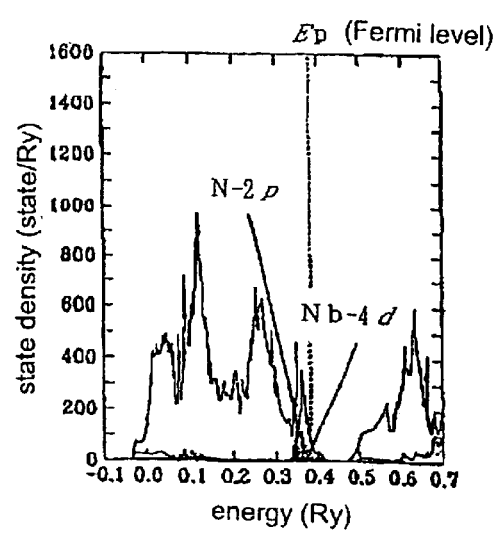

In order to check up on the effect of the co-doping during the laser MBE crystal grow of $SrTiO_3$, respective energy spectrums of state densities in the independent doping method and the co-doping method were measured to compare them with one another. The result is shown in FIGS. 4(a) and 4(b). FIG. 4(a) shows the state density in the independent doping method, together with a partial state density in the 2p region of N. FIG. 4(b) shows the state density in the method of co-doping N and Nb, together with a partial state density in the 2p region of N and a quadrupled partial state density in the 4d region of Nb. As can be seen from these energy spectrums, the conventional method of doping the acceptor N by itself provides a deep acceptor level and thereby the activation rate of a p-type carrier is low. By contrast, in the method of co-doping the acceptor N and the donor Nb at the rate of 2:1, the resulting energy spectrum of the electronic density of states shows that the acceptor/donor impurity complex comprised of N—Nb—N is formed through the co-doping, and the wave function of the acceptor N is strongly hybridized with the wave function of donor Nb to shift the acceptor level of N toward the lower energy side or the shallower side.

Further, the acceptor/donor impurity complex of N—Nb—N formed through the co-doping method provides a higher solid solubility limit of the acceptor than that in the independent doping method. The shallowed acceptor level and the heightened solid solubility limit of the acceptor support the realization of a p-type $SrTiO_3$ having a desirably lowered resistance.

The respective effects of the conventional method of doping the acceptor N by itself and the method of co-doping the acceptor N and the donor Nb at the ratio of 2:1 were compared under the condition that the substrate temperature was changed in the range of 500° C. and 800° C. during crystal growth. The result is shown in the following Table 1. The co-doping method could provide a significantly increased number, or four to six-digit-increased number, of carriers as compared to the independent doping method.

TABLE 1

| Substrate Temperature (° C.) | Acceptor Concentration (number/cm³) | |
|---|---|---|
| | Co-Doping of N and Nb | Independent Doping of N |
| 500 | $4.2 \times 10^{17}$ | $1.1 \times 10^{14}$ |
| 600 | $8.1 \times 10^{18}$ | $6.8 \times 10^{14}$ |
| 700 | $9.5 \times 10^{19}$ | $9.6 \times 10^{14}$ |
| 800 | $9.3 \times 10^{20}$ | $8.3 \times 10^{15}$ |

Second Example

Crystal Growth Through CVD Method

Figure 5:
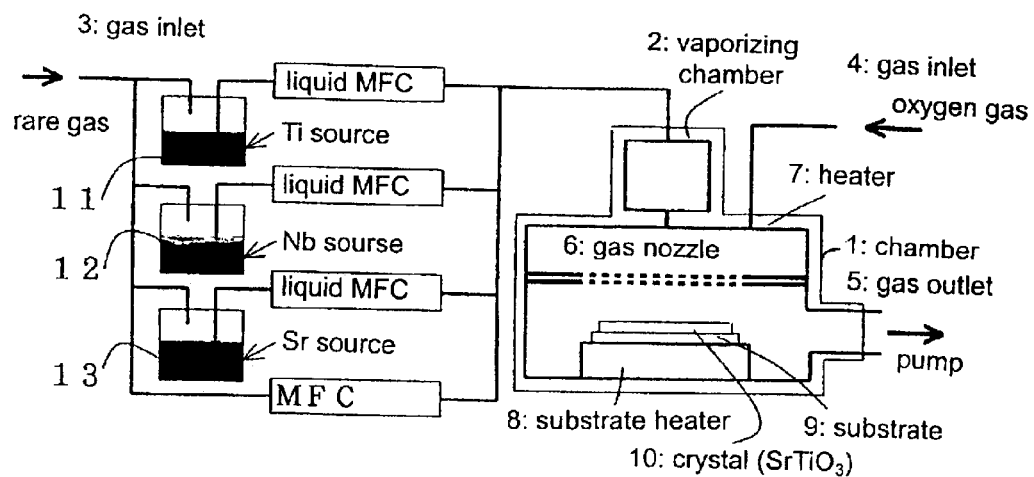
FIG. 5 is a schematic vertical sectional view of a CVD crystal-growth apparatus used in a second example of a method of the present invention.

FIG. 5 is a schematic vertical sectional view of a CVD crystal-growth apparatus used in this example. Based on the CVD method, organic metal complexes of Sr, Ti and Nb, i.e. Sr $(DPM)_2$, Ti $(DPM)_3$ and Nb $(DPM)_4$ (DPM: dipivaloymethanato), were reserved in vessels 11, 12 and 13, respectively, and used as starting materials.

Ammonia was used as a starting material of N. Each of the starting materials was discharged from the corresponding vessel by introducing rare gas from a gas inlet 3 into each of the vessels. The starting materials were heated up to a high temperature at a vaporizing chamber 2, and forcibly vaporized. The vapor of the starting materials was introduced in a chamber heated by a heater 7, and directed toward a substrate 9 through a gas nozzle 6 to grow a $SrTiO_3$ crystal 10 on the substrate 9 heated by a substrate heater 8. During this process, oxygen gas was introduced from a gas inlet 4 into the chamber 1 to prevent oxygen deficiency. Effluent gas in the chamber 1 was discharged from a gas outlet 5 by sucking with a pump.

The respective effects of the conventional method of doping the acceptor N by itself and the method of co-doping the acceptor N and the donor Nb at the ratio of 2:1 were compared under the condition that the substrate temperature was changed in the range of 200° C. and 300° C. during crystal growth. The result is shown in the following Table 2. The co-doping method could provide a significantly increased number, or four to six-digit-increased number, of p-type carriers as compared to the independent doping method. Hydrogen gas immixed during crystal growth can be removed by subjecting a $SrTiO_3$ thin-film after the crystal growth to annealing under oxygen atmosphere, and a further increase number of p-type carriers was observed in the annealed $SrTiO_3$ thin-film.

TABLE 2

| Substrate Temperature (° C.) | Acceptor Concentration (number/cm³) | |
|---|---|---|
| | Co-Doping of N and Nb | Independent Doping of N |
| 200 | $2.9 \times 10^{17}$ | $2.1 \times 10^{14}$ |
| 250 | $8.8 \times 10^{18}$ | $6.2 \times 10^{14}$ |
| 280 | $9.6 \times 10^{19}$ | $7.1 \times 10^{14}$ |
| 300 | $8.2 \times 10^{20}$ | $7.4 \times 10^{15}$ |

INDUSTRIAL APPLICABILITY

A low-resistance p-type $SrTiO_3$ will open the way for oxide electronics in combination with an already developed low-resistance n-type $SrTiO_3$.

Further, the p-type doping can provide adequately controlled properties of a ferroelectric material. This makes it possible to assure the capacity of a highly integrated and miniaturized memory cell, and to provide a new memory device with a high withstand voltage, usable in a DRAM (Dynamic Random Access Memories).

Thus, the low-resistance p-type $SrTiO_3$ can be used to achieve a nonvolatile memory excellent in high-speeding, low power consumption, high-level integration and rewrite resistance properties, and thereby applied to a system LSI or an IC chip card.

What is claimed is:

1. A method for preparing a low-resistance p-type $SrTiO_3$, comprising the step of:

co-doping an acceptor and a donor into a perovskite-type transition-metal oxide $SrTiO_3$ during crystal growth.

2. A method for preparing a low-resistance p-type $SrTiO_3$, comprising the step of:

co-doping an acceptor (A) and a donor (D) into a perovskite-type transition-metal oxide $SrTiO_3$ during crystal growth to form an impurity complex (A-D-A) of the acceptor and the donor through a crystal growth method in a thermal nonequilibrium state, whereby an impurity formation energy is reduced by less than that in a method of doping the acceptor by itself, so as to provide an increased concentration of the acceptor.

3. A method for preparing a low-resistance p-type $SrTiO_3$, comprising the step of:

co-doping an acceptor (A) and a donor (D) into a perovskite-type transition-metal oxide $SrTiO_3$ during crystal growth to form an impurity complex (A-D-A) of the acceptor and the donor through a crystal growth method in a thermal nonequilibrium state, whereby a Coulomb scattering mechanism having a long range force is converted into a dipole or multipole scattering mechanism having a short range force, so as to provide an increased mobility of the impurities.

4. A method for preparing a low-resistance p-type $SrTiO_3$ as defined in claim 1, comprising the step of:

co-doping an acceptor (A) and a donor (D) into a perovskite-type transition-metal oxide $SrTiO_3$ during crystal growth to form an impurity complex (A-D-A) of the acceptor and the donor through a crystal growth method in a nonequilibrium state, whereby the acceptor has a shallower impurity level than that in a method of doping N by itself, so as to provide an increased activation rate of the acceptor.

5. A method as defined in claim 1, wherein the donor is Nb oxide, and the acceptor is N oxide.

6. A method as defined in claim 1, wherein the donor is an n-type dopant of Nb (niobium), and the acceptor is a p-type dopant of N (nitrogen), wherein the n-type dopant of Nb and the p-type dopant of N are co-doped at a rate of 1:(1+x) where 0<x<100, so as to provide p-type carriers doped in a high concentration of $10^{19}$ cm$^{-3}$ to $10^{21}$ cm$^{-3}$.

* * * * *